United States Patent [19]

Cheng et al.

[11] Patent Number: 4,471,005

[45] Date of Patent: Sep. 11, 1984

[54] OHMIC CONTACT TO P-TYPE GROUP III-V SEMICONDUCTORS

[75] Inventors: Chu-Liang Cheng, Piscataway; Larry A. Coldren, Holmdel, both of N.J.

[73] Assignee: AT&T Bell Laboratories, Murray Hill, N.J.

[21] Appl. No.: 460,544

[22] Filed: Jan. 24, 1983

[51] Int. Cl.[3] .......... H01L 21/283

[52] U.S. Cl. .......... 427/89; 427/85; 357/67

[58] Field of Search .......... 427/89, 85; 357/67 R

[56] References Cited

U.S. PATENT DOCUMENTS

| | | | |
|---|---|---|---|
| 3,850,688 | 11/1974 | Halt | 117/217 |
| 3,959,036 | 5/1976 | Ketchow | 357/67 R |
| 3,975,555 | 8/1976 | Ladany et al. | 427/85 |
| 4,195,308 | 3/1980 | Hawrylo | 357/67 R |
| 4,366,186 | 12/1982 | Keramidas | 427/89 |

FOREIGN PATENT DOCUMENTS

| | | | |
|---|---|---|---|
| 54-69975 | 6/1979 | Japan | 357/67 R |

OTHER PUBLICATIONS

J. of Applied Physics, vol. 46, No. 1, Jan. 1975, "Ohmic Contacts for Moderately Resistive P-type InP" by L. M. Schiavone and A. A. Pritchard, pp. 452-453.

Solid-State Electronics, 1975, vol. 18, "A Review of the Theory and Technology for Ohmic Contacts to Group III-V Compound Semiconductors" by V. L. Rideout, pp. 541-550.

J. Electrochem. Soc.: Solid-State Science and Tech., "Contacts to p-Type InP" by F. A. Thiel et al. pp. 317-318 (vol. 124, No. 2, Feb. 1977).

J. Vac. Sci. Technol., 19 (3), Sep./Oct. 1981, "Ohmic Contacts to Lightly Doped n and p Indium Phosphide Surfaces" by W. Tseng, et al. pp. 623-625.

Solid-State Electronics, vol. 24, No. 1, "Low Resistance Ohmic Contacts to n- and p-InP" by E. Kuphal, pp. 69-78.

*Primary Examiner*—John D. Smith

*Attorney, Agent, or Firm*—Gregory C. Ranieri

[57] ABSTRACT

A plurality of pairs of layers comprising gold and zinc are successively evaporated onto a p-type Group III-V semiconductor material such as indium phosphide. A final layer of gold is evaporated onto the pairs of layers prior to heating the multilayer contact. Successive layers of chromium and gold may be evaporated onto the final gold layer prior to the annealing step.

26 Claims, 2 Drawing Figures

6
5
4
3
2
1

OHMIC CONTACT TO P-TYPE GROUP III-V SEMICONDUCTORS

TECHNICAL FIELD

This invention relates to the field of semiconductor device processing and, more particularly, to fabrication of external electrical contacts on compound semiconductors.

BACKGROUND OF THE INVENTION

Multilayer ohmic contacts have been fabricated on Group III-V semiconductor materials of n-type and p-type conductivity. A representative survey of contacts and contact fabrication technology in this area is disclosed in *Solid State Electronics,* Vol. 18, p. 541 (1975).

With respect to contacts on p-type material, particular difficulty has been encountered in obtaining a reliable ohmic contact suited for use on small contact area optoelectronic devices. Of those processes achieving a modicum of success in simply contacting p-type material, most have employed a combination of layers including gold and zinc. Zinc is utilized because it is usually incorporated as an acceptor in the epitaxial layers of the semiconductor material. However, zinc is known to have a high vapor pressure which results in evaporation of zinc during heat treatment of the contact.

U.S. Pat. No. 3,850,688 issued to I. Halt on Nov. 26, 1974, discloses a method or fabricating a multilayer contact which is designed to suppress the evaporation of zinc during a heat treatment step required for effecting the diffusion of zinc into the p-type semiconductor material. The method involves the sequential deposition of a thick layer of gold (500–5000 angstroms) followed by a thick layer of gold-zinc alloy (1000–10,000 angstroms) and a thick second layer of gold (500–5000angstroms).

A number of other relatively thick gold and zinc multilayer contacts have been fabricated for p-type Group III-V semiconductor material. See, for example, *Solid-State Electronics,* Vol. 24, p. 69 (1981); *J. Vac. Sci. Technol.,* 19(3), p. 623 (1981); *J. Electrochem. Soc.,* Vol. 124, No. 2, p. 317 (1977); *J. of Appl. Phys.,* Vol. 46, No. 1, p. 452 (1975); and U.S. Pat. No. 3,975,555 issued to I. Ladany et al. on Aug. 17, 1976.

In all of the references mentioned above, each ohmic contact is relatively thick and exhibits a moderate specific contact resistance ($\sim 10^4\ \Omega cm^2$).

SUMMARY OF THE INVENTION

A thin, low resistance, multilayer contact is fabricated for a p-type Group III-V semiconductor material, such as indium phosphide, in accordance with an aspect of the invention, by sequential deposition of alternating gold and Group II metallic layers on a surface of the material and by heating the material to interdiffuse the Group II metal at least partially into the surface of the material. A first layer of the contact is comprised of gold and a final layer is also comprised of gold.

In a preferred embodiment, the contact is comprised of a first gold layer evaporated on the surface on the p-type semiconductor material, a first zinc layer evaporated on the first gold layer, a second gold layer evaporated on the first zinc layer, a second zinc layer evaporated on the second gold layer, and a third gold layer evaporated on the second zinc layer. Following evaporation of the successive contact layers, the contact is heated into a given temperature range to interdiffuse zinc into at least the surface of the semiconductor material.

In an alternative embodiment, the multilayer contact includes the first, second, and third gold layers sequentially evaporated alternately with the first and second zinc layers, as described above, a diffusion barrier layer of chromium is evaporated on the third gold layer, and a fourth gold layer evaporated on the chromium layer. Following evaporation of the contact layers, the contact is heated.

BRIEF DESCRIPTION OF THE DRAWING

A more complete understanding of the invention may be obtained by reading the following description of a specific illustrative embodiment of the invention in conjunction with the appended drawings in which.

DETAILED DESCRIPTION

Figure 1:
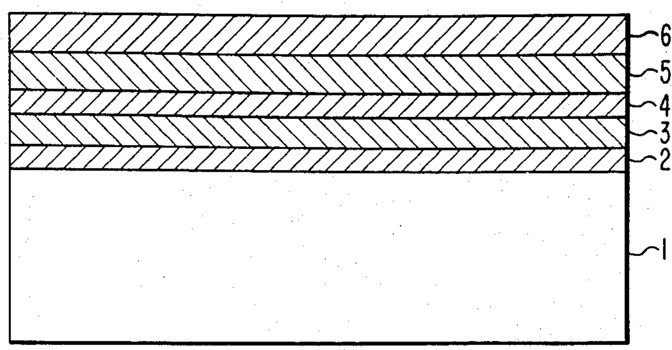
FIG. 1 is a diagram of a five layer p-type contact comprised of alternating gold and Group II metallic layers.
Figure 2:
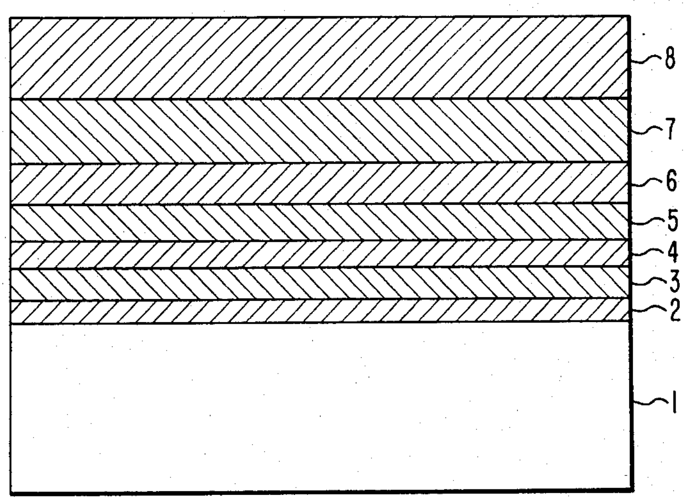
FIG. 2 is a diagram of a seven layer p-type contact incorporating a diffusion barrier therein.

FIGS. 1 and 2 show multilayer ohmic contacts to p-type Group III-V semiconductor layer 1. Semiconductor layer 1 is comprised of InP or GaAs or any of the ternary or quaternary derivatives thereof. For ease of explanation and not for purposes of limitation, layer 1 will be described as being comprised of InP.

The multilayer ohmic contact shown in FIG. 1 is deposited one layer at a time on a surface of semiconductor layer 1. Contact layers 2 through 6 are comprised alternately of gold and a Group II metallic element. Preferred Group II metallic elements for the purposes of this invention include zinc, beryllium, magnesium and cadmium. Of these elements, zinc is perhaps most widely used for p-type ohmic contacts even though zinc possesses a high vapor pressure and tends to evaporate when heated. In the description which follows, Group II metallic layers will be described as being comprised of zinc for exemplary and illustrative purposes only and not for purposes of limitation.

In order to deposit the multilayer ohmic contact on the semiconductor material, it is necessary occasionally to prepare a masking window on the surface of p-type semiconductor layer 1. This is accomplished by plasma deposition of a silicon nitride film of approximately 1000 angstroms. Standard photolithographic patterning techniques are utilized to define a contact window in the silicon nitride film. Plamsa etching permits removal of the silicon nitride from the contact window. Another photolithographic patterning step is performed to define a contact pad. A resist such as Shipley AZ1350J may be used in this patterning step. After a short post-baking period, the semiconductor material is etched to remove an oxide layer from the surface to be contacted on layer 1. Oxide removal may be performed by etching briefly in buffered HF, followed by another brief period of etching in a 3:1 solution of acetic acid and peroxide. At this point, the contact can be deposited in the window on semiconductor layer 1.

Deposition is carried out sequentially with alternate layers of gold and zinc (Group II metallic element). Deposition techniques involve either evaporation or electroplating. Evaporation is the preferred method of deposition because it is easily controlled and capable of reproducing uniform contacts. Evaporation is performed at a slow rate using separate gold and zinc sources. A satisfactory evaporation rate for each source is in the range of 5.0 angstroms/sec. While electroplating is an alternative approach to evaporation, it is known that electroplating is not as easily controllable as evaporation and that the uniformity of electroplated contact layers varies with impurity concentration of semiconductor layer 1.

Contact layer 2 is the first contact layer and is deposited on the surface of semiconductor layer 1. Layer 2 is a thin layer comprised of gold. This thin layer tends to wet the surface of the p-type Group III-V semiconductor material and thereby promote adhesion of the multilayer contact. Layer 2 is preferably 25–50 angstroms thick to promote adhesion and permit interdiffusion of zinc from other zinc layers with the indium phosphide in layer 1.

Contact layer 3 is the second contact layer and is deposited over contact layer 2. Layer 3 is comprised of zinc. Zinc is a common p-type dopant which is diffused through layer 1 to form a highly doped, shallow region in layer 1 beneath the contact. Layer 3 is relatively thin, preferably 75–200 angstroms, to ensure sufficient doping of semiconductor layer 1 and good adhesion to layer 2.

Contact layer 4 is the third contact layer and is deposited over contact layer 3. Layer 4 is designed to be at least the thickness of layer 2, yet sufficiently thin to allow interdiffusion of zinc with the indium phosphide and gold layers.

Contact layer 5 is the fourth contact layer and is deposited over gold contact layer 4. Layer 5 is generally similar in thickness to layer 3, i.e., in the range of 75–200 angstroms.

Contact layer 6 is the fifth contact layer and is deposited over zinc contact layer 4. Layer 6 is of sufficient thickness to confine zinc which evaporates during heating, to prevent oxidation of the zinc surface, and to effect the desired percent by weight composition of gold and zinc.

There appear to be several factors which affect the operation and characteristics of the multilayer contact. One of the factors is thickness of the contact and another factor is overall composition of the contact which is related to the thickness. With respect to contact thickness, it is presently understood that the overall contact thickness should be less than 2000 angstroms. As such, alloying of the contact with the semiconductor is limited to a small region and the depth of gold diffusion is limited to a shallow region in the semiconductor.

With respect to overall composition of the contact, it has been found from experimental practice that an overall composition in the range of 10 percent to 30 percent by weight of zinc in gold and, more specifically, of approximately 25 percent by weight of zinc in gold is desirable for a substantial reduction of the specific contact resistance of the multilayer contact. The 25 percent by weight of zinc in gold composition is achieved when the sum of thicknesses for the gold layers, i.e., layers 2, 4 and 6, is substantially equal to the sum of thicknesses for the zinc layers, i.e., layers 3 and 5. For an exemplary contact of 400 angstroms thickness exhibiting the desired composition of 25 percent by weight zinc in gold, the following layer thicknesses were measured: layers 2 and 4 at 50 angstroms each, layers 3 and 5 at 100 angstroms each, and layer 6 at 100 angstroms.

After contact layers 2 through 6 have been deposited on semiconductor layer 1, the contact is heated to cause interdiffusion of zinc into the semiconductor material or doping as well as into the contact layers of gold for alloying. Heating can be performed by a sintering process or by an annealing process. In either case, the contact is heated into a temperature range of 400 to 500 degrees Centigrade for a time desirably less than 5 seconds but in no event exceeding 5 minutes in a constant flow of forming gas. Short exposure times for the contact in the suggested temperature range reduce the probability of deep diffusion of gold into the semiconductor layer.

Annealing can be performed using a graphite strip heater having a thermocouple embedded therein for accurate temperature control. Heating from room temperature to annealing temperature is done at approximately the same rate as cooling from the annealing temperature to room temperature. The annealing temperature is defined as the maximum temperature attained in the range of 400 to 500 degrees Centigrade, as described above.

FIG. 2 shows a multilayer contact which includes a diffusion barrier depicted as contact layers 7 and 8 over the contact shown in FIG. 1. Semiconductor layer 1 and contact layers 2 through 6 of the contact in FIG. 2 have been described in reference to FIG. 1 and will not be repeated here.

After contact layer 6 has been deposited, contact layer 7 is deposited over layer 6 to act as a diffusion barrier. Layer 7 is comprised of a transition metal such as chromium which is capable of substantially eliminating "out-diffusion" of indium, phosphorus, and zinc through layer 6. Alternatively, layer 7 can be comprised of other transition metals such as titanium or palladium.

Contact layer 8, which is comprised of gold, is deposited over layer 7. Layer 8 is sufficiently thick to reduce sheet resistance of the multilayer contact. After layers 7 and 8 have been deposited, the contact is heated to permit interdiffusion of zinc with the gold and semiconductor layers. The heating process is described above in reference to FIG. 1.

In an example from experimental practice, layer 7 is aproximately 200 to 400 angstroms in thickness, and layer 8 is approximately 500 to 2000 angstroms thick.

The multilayer contacts shown in FIGS. 1 and 2 are characterized by a low specific contact resistance, good adhesion properties, and defect free contact surfaces providing for uniform current distribution.

Although not shown or described above, one apparent modification of this invention is the use of fewer than five contact layers. For example, a three layer contact can be comprised of alternating layers of gold and zinc. One illustrative three layer contact exhibiting a composition of 25 percent by weight zinc in gold may have the following layer thicknesses: a first gold layer of 50 angstroms, a first zinc layer of 150 to 200 angstroms, and a second gold layer of 100 to 150 angstroms.

Preferred embodiments of this invention have been shown and described above. Various other embodiments and modifications of the present invention will become apparent to persons skilled in the art and will be within the scope as defined in the following claims.

What is claimed is:

1. A method of making an ohmic contact having a plurality of layers on a surface of a Group III-V semiconductor material of p-type conductivity, the method comprising the steps of depositing a first contact layer comprising gold onto the surface of the semiconductor material, depositing a second contact layer comprising a Group II metallic element over the first contact layer, depositing a third contact layer comprising gold over the second contact layer so that a total thickness for the contact is less than 2000 angstroms, and heating the semiconductor material and the plurality of layers to cause interdiffusion of the Group II metallic element at least partially into the surface of the semiconductor material.

2. The method as defined in claim 1 wherein the Group II metallic element is zinc.

3. The method as defined in claim 2 wherein the thickness of the second layer is related to the sum of thicknesses for the first and third layers in a predetermined manner so that the contact has an overall composition in the range of 10 percent to 30 percent by weight of zinc in gold.

4. The method as defined in claim 3 wherein the thickness of the second layer is substantially equal to the sum of thicknesses for the first and third layers.

5. The method as defined in claim 3 wherein the contact has an overall composition substantially equal to 25 percent by weight of zinc in gold.

6. The method as defined in claim 4 wherein the second contact layer has a thickness of less than 200 angstroms.

7. The method as defined in claim 6 wherein the first contact layer has a thickness of less than 100 angstroms.

8. A method of making an ohmic contact having a plurality of layers on a surface of a Group III-V semiconductor material of p-type conductivity, the method comprising the steps of depositing a first contact layer comprising gold onto the surface of the semiconductor material, depositing a second contact layer comprising a Group II metallic element over the first contact layer, depositing a third contact layer comprising gold over the second contact layer, depositing a fourth contact layer comprising the Group II metallic element over the third contact layer, depositing a fifth contact layer comprising gold over the fourth contact layer, and heating the semiconductor material and the plurality of layers to cause interdiffusion of the Group II metallic element at least partially into the surface of the semiconductor material.

9. The method as defined in claim 8 wherein the plurality of layers of the contact have a total thickness which is less than 2000 angstroms.

10. The method as defined in claim 9 wherein the Group II metallic element is zinc.

11. The method as defined in claim 10 wherein a sum of thicknesses of the first, third and fifth contact layers is related to a sum of thicknesses for the second and fourth contact layers in a predetermined manner so that the contact has an overall composition in the range of 10 percent to 30 percent by weight of zinc in gold.

12. The method as defined in claim 11 wherein the sum of thicknesses of the first, third and fifth contact layers is substantially equal to the sum of thicknesses of the second and fourth contact layers.

13. The method as defined in claim 11 wherein the contact has an overall composition substantially equal to 25 percent by weight of zinc in gold.

14. A method as defined in claim 12 wherein the second contact layer has a thickness of less than 200 angstroms and the fourth contact layer has a thickness of less than 200 angstroms.

15. The method as defined in claim 14 wherein the first contact layer has a thickness of less than 100 angstroms.

16. A method of making an ohmic contact having a plurality of layers on a surface of a Group III-V semiconductor material of p-type conductivity, the method comprising the steps of depositing a first contact layer comprising gold onto the surface of the semiconductor material, depositing a second contact layer comprising a Group II metallic element over the first contact layer, depositing a third contact layer comprising gold over the second contact layer, depositing a fourth contact layer comprising the Group II metallic element over the third contact layer, depositing a fifth contact layer comprising gold over the fourth contact layer, depositing a sixth contact layer comprising a transition metal over the fifth contact layer, depositing a seventh contact layer comprising gold over the sixth contact layer, and heating the semiconductor material and the plurality of layers to cause interdiffusion of the Group II metallic element at least partially into the surface of the semiconductor material.

17. The method as defined in claim 16 wherein a sum of thicknesses for the first through fifth contact layers is less than 2000 angstroms.

18. The method as defined in claim 17 wherein the Group II metallic element is zinc.

19. The method as defined in claim 18 wherein a sum of thicknesses of the first, third and fifth layers is related to a sum of thicknesses for the second and fourth layers in a predetermined manner so that the contact exclusive of the sixth and seventh contact layers has an overall composition in the range of 10 percent to 30 percent by weight of zinc in gold.

20. The method as defined in claim 19 wherein the sum of thicknesses of the first, third and fifth layers is substantially equal to the sum of thicknesses of the second and fourth layers.

21. The method as defined in claim 19 wherein the contact exclusive of the sixth and seventh contact layers has an overall composition substantially equal to 25 percent by weight of zinc in gold.

22. A method as defined in claim 20 wherein the second contact layer has a thickness of less than 200 angstroms and the fourth contact layer has a thickness of less than 200 angstroms.

23. The method as defined in claim 22 wherein the first contact layer has a thickness of less than 100 angstroms.

24. The method as defined in claim 23 wherein the transition metal is chromium.

25. The method as defined in claim 23 wherein the transition metal is titanium.

26. The method as defined in claim 23 wherein the transition metal is palladium.

* * * * *